United States Patent [19]

Kurafuji

[11] 4,446,386
[45] May 1, 1984

[54] MOS DECODER CIRCUIT USING PHASE CLOCKING FOR REDUCING THE POWER CONSUMPTION

[75] Inventor: Setsuo Kurafuji, Yokohama, Japan
[73] Assignee: Fujitsu Limited, Kawasaki, Japan
[21] Appl. No.: 210,661
[22] Filed: Nov. 26, 1980
[30] Foreign Application Priority Data
Nov. 29, 1979 [JP] Japan .................. 54-154580
[51] Int. Cl.$^3$ .................. H03K 19/096; H03K 19/20; G11C 8/00
[52] U.S. Cl. .................. 307/449; 307/450; 365/230
[58] Field of Search .................. 365/230, 231; 307/449, 307/463, 450, DIG. 5

[56] References Cited

U.S. PATENT DOCUMENTS

| | | | |
|---|---|---|---|
| 3,980,899 | 9/1976 | Shimada et al. | 307/449 X |
| 4,063,118 | 12/1977 | Nishimura | 307/449 |
| 4,185,320 | 1/1980 | Takemae et al. | 307/463 |
| 4,198,700 | 4/1980 | Aoyama et al. | 307/DIG. 5 X |
| 4,275,312 | 6/1981 | Saitou et al. | 307/463 |

Primary Examiner—Larry N. Anagnos
Assistant Examiner—David R. Bertelson
Attorney, Agent, or Firm—Staas & Halsey

[57] ABSTRACT

In a decoder circuit in which a transistor for reducing power use, which is supplied at its gate with a first control signal, is connected in series with a logical gate composed of a load transistor and a plurality of transistors which are respectively supplied at their gates with address signals, there is provided an off buffer circuit which comprises a first inverter for receiving the output of the logical gate and a second inverter for receiving the output of the first inverter. To a load transistor of the second inverter is provided a second control signal delayed in phase behind the first control signal and the output of the off buffer circuit is used as a decoded output of the address signal, so that the rise and fall of a word line is reduced.

11 Claims, 4 Drawing Figures

MOS DECODER CIRCUIT USING PHASE CLOCKING FOR REDUCING THE POWER CONSUMPTION

BACKGROUND OF THE INVENTION

1. Field of the Invention

The present invention relates to a decoder circuit having small power consumption.

2. Description of the Prior Art

A decoder circuit, for decoding an address signal for selecting a memory cell of a memory circuit, selects one of a plurality of word lines of the memory circuit and one or two of its bit lines. Such a decoder circuit is usually comprised of a NOR gate. It is determined that a particular word line is selected or unselected in dependence upon whether the decoded output is a high-level or a low-level. When the low-level output is produced, a current flows from the power supply via the NOR gate to the ground side, causing power consumption.

With an increase in the capacity of the memory circuit, the number of word lines and bit lines increase and the scale of the decoder circuit becomes large because it is selecting among the large number of word lines and bit lines addressed by the address signal. For example, when one word line is selected leaving the other word lines unselected, a number of decoders yield the low-level outputs, resulting in a large current flow and causing the total power dissipation to become so large that it can not be considered negligible. Accordingly, it is necessary to reduce such power dissipation.

For example, a large capacity memory circuit is usually formed by packaging a plurality of memory cards, each memory card having mounted on its print board a plurality of LSI memory chips each of which has a large number of memory cells because each chip has a high density of components. When accessing the memory circuit, a chip select signal is used for selecting a desired one of the memory chips. It has been proposed to cut power consumption by connecting the power source only to the decoder circuit of the memory chip selected by the chip select signal.

For instance, FIG. 1 shows the principal part of a conventional decoder circuit, illustrating only the part corresponding to one word line. In FIG. 1, reference character Qa indicates a depletion type load MOS transistor; Qb designates an enhancement type MOS transistor for power cutting use; and $Q_0$ to $Q_n$ identify MOS transistors comprising a NOR gate. The MOS transistors $Q_0$ to $Q_n$ have their drains conected together to the source of the transistor Qb to receive a voltage signal and a word line WD and to have their sources grounded or connected to a low-potential point and are supplied at their gates with address signals $A_0$ to $A_n$, respectively. When a chip select signal $\phi_0$ becomes the high-level, the MOS transistor Qb is turned ON and, in this case, if the MOS transistors $Q_0$ to $Q_n$ forming the NOR gate are all in the OFF state, a power supply voltage $V_{DD}$ is applied via the MOS transistors Qa and Qb to the word line WD. In other words, when all bits of the address signals $A_0$ to $A_n$ are the low-level, the word line WD becomes the high-level and is thus selected by the address signal.

When one or more bits of the address signals $A_0$ to $A_n$ are high-level, the MOS transistors corresponding to the high-level bits are turned ON, by which the word line WD assumes the ground potential or the potential of the low-potential point; namely, the word line WD becomes low-level and therefore unselected. Assuming, for example, that only the address signal $A_1$ becomes high-level, the MOS transistor $Q_1$ is turned on and consequently the current supplied by the power supply voltage $V_{DD}$ flows via the MOS transistors Qa, Qb and $Q_1$ to the ground side. In an unselected memory chip, however, since the chip select signal $\phi_0$ becomes low-level, the MOS transistor Qb is turned OFF to cut off the current flowing through the NOR gate, thus reducing power dissipation.

With the inclusion of the MOS transistor Qb which is turned ON and OFF by the chip select signal $\phi_0$, as described above, it is possible to cut the power dissipation of unselected memory chips, but this method poses such problems as mentioned below. Since the word line WD has connected thereto a number of static memory cells, each formed, for example, by a flip-flop, the stray capacitance of the word line WD is relatively large. When the word line WD is selected, it is necessary to charge its stray capacitance, so that the rise-up time of the word line WD becomes long. Further, in order that the word line WD, once charged, may be made unselected, charges stored in the word line WD must be discharged by making any one of the address signals $A_0$ to $A_n$ the high-level to turn ON one or more of the MOS transistors $Q_0$ to $Q_n$ forming the NOR gate. For rapid charging and discharging of the word line WD, it is necessary to employ large current capacity MOS transistors as the MOS transistors Qa, Qb and $Q_0$ to $Q_n$, but this creates the problems that a large current flows when the word line WD is unselected and that the stray capacitance of the MOS transistors $Q_0$ to $Q_n$ forming the NOR gate becomes so large as to increase the load capacitance of the address signal line, resulting in the operating speed of the NOR gate being reduced.

SUMMARY OF THE INVENTION

It is an object of the present invention to cut the power consumption of a decoder circuit.

Another object of the present invention is to ensure rapid rise and fall of the potential of a word line selected by a decoder circuit.

Another object is to prevent multiple selection of a word line by a decoder circuit.

Briefly state, according to the present invention, a decoder circuit for decoding an address signal comprises a logical gate which is supplied with a power supply voltage via a power reducing transistor which is supplied at its gate with a first control signal, a first inverter which is supplied with the output from the logical gate, and a second inverter which is supplied with the output from the first inverter. To a load transistor of the second inverter is applied a second control signal which is delayed in phase relative to the first control signal and the output from the second inverter is used as the decoded output.

DESCRIPTION OF THE PREFERRED EMBODIMENTS

Figure 1:
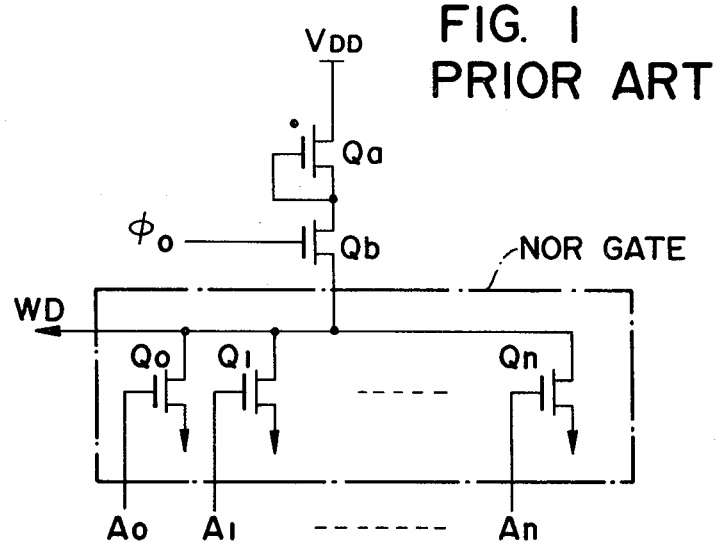
FIG. 1 is a circuit diagram illustrating the principal part of a conventional decoder circuit.
Figure 2:
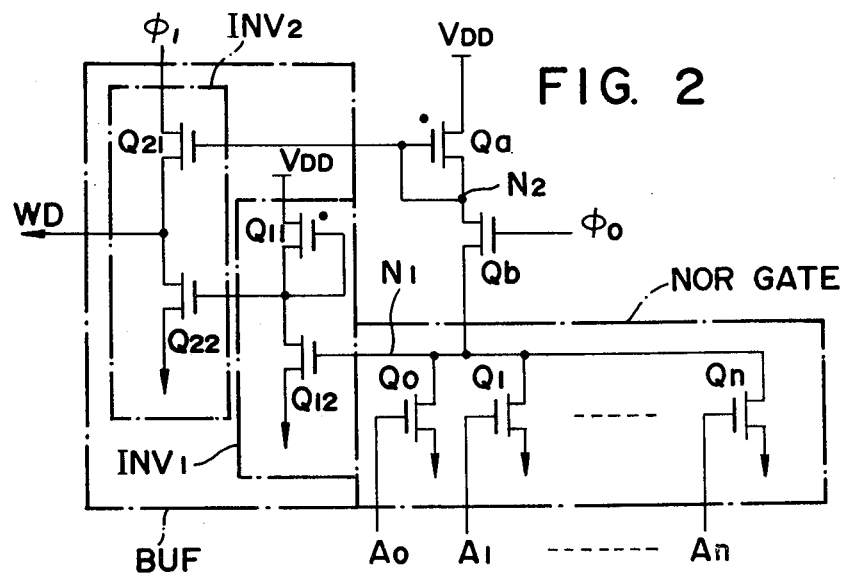
FIG. 2 is a circuit diagram illustrating the principal part of an embodiment of the present invention.

FIG. 2 shows the principal part of an embodiment of the present invention and the parts corresponding to those in FIG. 1 are identified by the same reference characters. In FIG. 2, reference character BUF indicates an off buffer circuit composed of first and second inverters $INV_1$ and $INV_2$; $Q_{11}$, $Q_{12}$, $Q_{21}$ and $Q_{22}$ designate MOS transistors (hereinafter referred to simply as the transistors); $\phi_0$ identifies a chip select signal or a first control signal which is derived from the chip select signal; and $\phi_1$ denotes a second control signal which is derived from the first control signal $\phi_0$ and delayed in phase behind it. An output point $N_1$ of the NOR gate constituted by the transistors $Q_0$ to $Q_n$, which are respectively supplied at their gates with the address signals $A_0$ to $A_n$, is connected to the gate of the transistor $Q_{12}$ of the first inverter $INV_1$, the output of transistor $Q_{12}$ is provided to the gate of the transistor $Q_{22}$ of the second inverter $INV_2$, the output of the transistor $Q_{22}$ is applied to the word line WD. To the drain of the load transistor $Q_{21}$ of the second inverter $INV_2$ is applied the second control signal $\phi_1$ and the gate of the load transistor $Q_{21}$ is connected to the gate of the load transistor $Q_a$ to receive a voltage signal.

Figure 3:
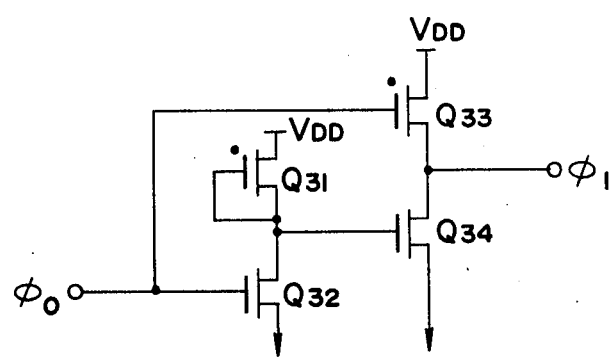
FIG. 3 is a second control signal generator circuit.

FIG. 3 shows an example of a second control signal generator circuit. In FIG. 3, reference characters $Q_{31}$ and $Q_{33}$ indicate depletion type transistors; and $Q_{32}$ and $Q_{34}$ designate enhancement type transistors.

Figure 4:
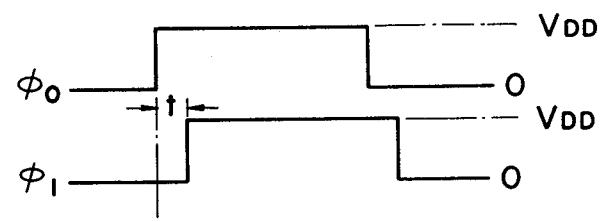
FIG. 4 is an explanatory of the first and second control signals.

FIG. 4 is explanatory of the first and second control signals $\phi_0$ and $\phi_1$. When the first control signal $\phi_0$ is the low-level, the transistor $Q_{32}$ of FIG. 3 is OFF and the transistor $C_{34}$ is ON, so that the second control signal $\phi_1$ is also low-level. When the first control signal $\phi_0$ becomes high-level, the transistor $Q_{32}$ is turned ON but, due to a lag in the operation of the transistors $Q_{32}$ and $Q_{34}$, the switching of the transistor $Q_{34}$ from the ON state to the OFF state is retarded. Upon turning OFF of the transistor $Q_{34}$, the second control signal $\phi_1$ assumes the high level which is equal to the level of the power supply voltage $V_{DD}$. Also when the first control signal $\phi_0$ changes from the high level to the low level, the switching of the second control signal $\phi_1$ from the high level to the low level is retarded. Accordingly, the second control signal $\phi_1$ overlaps with the first control signal $\phi_0$ and lags behind the first control signal $\phi_0$ by a time t, as shown in FIG. 4.

In FIG. 2, when all the bits of the address signals $A_0$ to $A_n$ become low-level and the first control signal $\phi_0$ becomes high, the potential at the output point $N_1$ immediately becomes high-level because the word line WD is not directly connected thereto. As a consequence, the transistor $Q_{12}$ is turned ON to render the output from the first inverter $INV_1$ low-level. In the second inverter $INV_2$ the transistor $Q_{22}$ is, thus, turned OFF. Since the level at a point $N_2$ is high, the high-level is applied to the gate of the load transistor $Q_{21}$ of the second inverter $INV_2$.

The time t after the first control signal $\phi_0$ becomes the high-level, the second control signal $\phi_1$ generated by the current of FIG. 3 becomes high-level and, at this instant, the high-level potential is provided to the gate of the transistor $Q_{21}$ only in the selected decoder circuit, so that a current flows from an output terminal (indicated by $\phi_1$) of a low-impedance drive circuit (FIG. 3) only to the transistor $Q_{21}$ as if the drain of the transistor $Q_{21}$ is connected to the power supply $V_{DD}$, and the word line WD rapidly becomes high-level. In other words, the word line WD is selected by the address signal.

In this case, since the gate potential of the transistor $Q_{21}$ and the level of the second control signal $\phi_1$ are equal to the level of the power supply voltage $V_{DD}$, the potential of the word line WD becomes $V_{DD}-V_{th}$ due to a threshold voltage $V_{th}$ of the transistor $Q_{21}$. The current capacities of the transistors $Q_{21}$ and $Q_{22}$ are selected as large, by which it is ensured that even if the stray capacitance of the word line WD is relatively large, it is rapidly charged by the high level of the second control signal $\phi_1$, permitting a steep rise of the potential of the word line WD.

When the first control signal $\phi_0$ changes from the high level to the low level, the second control signal $\phi_1$ also changes from the high level to the low level thus turning OFF the transistor $Q_{12}$ and ON the transistors $Q_{21}$ and $Q_{22}$. As a consequence, the word line WD is connected via the transistors $Q_{21}$ and $Q_{22}$ to the low-level side and the stored charges of the stray capacity of the word line WD are rapidly discharged, resulting in the potential of the word line WD falling sharply. Accordingly, the potential of the word line being selected rapidly rises and when the selected state shifts to the unselected state, the potential of the word line immediately falls, so that the selection of the next word line can be started smoothly without multiple selection. In this way, the memory accessing operation can be speeded up.

In the state of selecting a memory chip, when the first control signal $\phi_0$ is the high-level and any one of the bits of the address signals $A_0$ to $A_n$ is the high-level in order to hold the word line in the unselected state, the potential at the output point $N_1$ of the NOR gate is low-level and the potential at the point $N_2$ is also low-level. Consequently, even if the second control signal $\phi_1$ becomes high-level, the transistor $Q_{21}$ is turned OFF and the transistor $Q_{22}$ ON, so that the word line WD is retained at the low-level. Further, when the transistor of the NOR gate which corresponds to the high-level one of the bits of the address signals $A_0$ to $A_n$ is turned ON these flowing therethrough is a current from the power supply voltage $V_{DD}$; however, by forming the transistors $Q_a$, $Q_b$ and $Q_0$ to $Q_n$ so that they have a small current capacity ones, the power dissipation can be reduced.

Assuming that in the off buffer circuit BUF, the power supply voltage $V_{DD}$ is applied to the drain of the transistor $Q_{21}$ without using the second control signal $\phi_1$ and that the output point $N_1$ of the NOR gate is connected to the gate of the transistor $Q_{21}$, the potential at the output point $N_1$ of the NOR gate when the transistor $Q_b$ is ON becomes $V_{DD}-V_{th}$ due to the threshold voltage $V_{th}$ of the transistor $Q_b$ and this potential is applied to the gate of the transistor $Q_{21}$. Assuming that the threshold voltage of the transistor $Q_{21}$ is also $V_{th}$, the potential, $V_{DD}-2\cdot V_{th}$, is provided as the high level to the word line WD. That is, as compared with the foregoing embodiment of the present invention, the high level of the word line WD is relatively low and the charging time of the stray capacity becomes long, resulting in a slow rise of the potential of the word line. Moreover, because the charge in the stray capacitance of the word line WD is discharged through the transistor $Q_{22}$ alone, the fall of the potential of the word line WD also slows down, when the word line is changed from the selected state to the unselected state.

In contrast thereto, the present invention ensures rapid rise and fall of the potential of the word line WD by the use of the first and second control signals $\phi_0$ and $\phi_1$, as described previously.

As has been described in the foregoing, according to the present invention, the power consumption during the memory chip unselected state can be reduced by the transistor Qb used for reducing power and when the memory chip is selected, the potential of the word line selected by the address signal can be made to rise rapidly. Further, when the word line is changed from the selected state to the unselected state, the potential of the word line rapidly falls, so that even if the next word line is immediately selected, there is no fear of multiple selection. In addition, since the transistors comprising the NOR gate, the transistor for power reduction and the load transistor may be small current capacity ones, the current which flows in the NOR gate when the word line is unselected can be decreased. This also contributes to the reduction in power consumption. Further, the current capacities of the transistors of inverter $INV_2$ can be larger than those of transistor $Q_b$ and the NOR gate transistors.

It will be apparent that many modifications and variations may be effected without departing from the scope of the novel concepts of this invention.

What is claimed is:

1. A decoder circuit, operatively connectable to receive address signals, a first control signal and a second control signal, comprising:
   a transistor for power reducing use, having a gate operatively connectable to receive the first control signal;
   a logic gate, including:
      a first load transistor; and
      a plurality of logic transistors, each having a gate operatively connectable to receive one of the address signals, for generating a logic gate output signal, said transistor for power reducing use operatively connected to said first load transistor forming a connection point therebetween and to said plurality of logic transistors; and
   an off buffer circuit, including:
      a first inverter, operatively connected to said logic gate, for receiving the logic gate output signal and for generating an inverted output signal; and
      a second inverter, for providing the decoder circuit output, operatively connected to said first inverter, for receiving the inverted output signal and operatively connectable to receive the second control signal delayed in phase behind and overlapping the first control signal, said second inverter including:
         a second load transistor for receiving the second control signal; and
         a driving transistor operatively connected to said second load transistor at said decoder circuit output, and to said first inverter to receive the inverted output signal.

2. A decoder circuit according to claim 1, wherein the current capacities of said second load transistor and said driving transistor are selected larger than the current capacities of said transistor for power reducing use and said plurality of logic transistors comprising said logic gate.

3. A decoder circuit, operatively connectable to a word line and first and second reference voltages, and operatively connectable to receive a chip select signal and to receive N address signals, said decoder circuit comprising:
   a power supply circuit, operatively connectable to receive the chip select signal, for generating first and second voltage signals when the chip select signal is received;
   a NOR gate, having a first input operatively connected to said power supply circuit for receiving the first voltage signal, having N address signal inputs for receiving the N address signals, and having an output for generating a first decoded output signal;
   an OFF buffer circuit, having a first input operatively connected to the output of said NOR gate for receiving the first decoded output signal, having a second input, having a third input operatively connected to said power supply circuit for receiving the second voltage signal, and having an output operatively connected to the word line for generating a second decoded output signal which is used to select the word line; and
   a signal generator circuit, having an input operatively connectable to receive the chip select signal and having an output operatively connected to the second input of said OFF buffer circuit, for generating a delayed chip select signal overlapping the chip select signal and delayed in phase with respect to the chip select signal.

4. A decoder circuit according to claim 3, wherein said power supply circuit comprises:
   a first transistor having a first terminal operatively connected to the first reference voltage, having a second terminal operatively connected to the third input of said OFF buffer circuit for outputting the second voltage signal, and having a third terminal operatively connected to the second terminal; and
   a second transistor having a first terminal operatively connected to the third terminal of said first transistor, having a second terminal operatively connectable to receive the chip select signal, and having a third terminal operatively connected to the first input of said NOR gate for outputting the first voltage signal.

5. A decoder circuit according to claim 4, wherein said NOR gate comprises N transistors each having a first terminal, operatively connected to said power supply circuit at a first node for receiving the first voltage signal and for outputting the first decoded output signal, wherein the first node is operatively connected to the first input of said OFF buffer circuit, each of said N transistors having a second terminal operatively connectable to receive one of the respective N address signals and each having a third terminal operatively connected to the second reference voltage.

6. A decoder circuit according to claim 3, wherein said OFF buffer circuit comprises:
   a first inverter circuit, operatively connected to said NOR gate, for receiving the first decoded output signal and for generating an inverted signal; and
   a second inverter circuit, operatively connected to said first inverter circuit and to said power supply circuit for receiving the inverted signal and the second voltage signal and having an output operatively connected to the word line.

7. A decoder circuit according to claim 6, wherein said first inverter circuit comprises:
   a first transistor having a first terminal operatively connected to the first reference voltage, and having second and third terminals operatively connected at a second node; and a second transistor having a first terminal operatively connected at the second node, for outputting the inverted signal, having a second terminal, operatively connected to said NOR gate, for receiving the first decoded output signal and having a third terminal operatively connected to the second reference voltage.

8. A decoder circuit according to claim 6, wherein said second inverter circuit comprises:

a first transistor having a first terminal, operatively connected to said signal generator circuit, for receiving the delayed chip select signal, having a second terminal, operatively connected to said power supply circuit for receiving the second voltage signal and having a third terminal operatively connected to the word line; and a second transistor having a first terminal operatively connected to the word line, having a second terminal operatively connected to the second node of said first inverter circuit, for receiving the inverted signal and having a third terminal operatively connected to the second reference voltage.

9. A decoder circuit, operatively connectable to a word line and first and second reference voltages, and operatively connectable to receive a chip select signal and N address signals, said decoder circuit comprising:

a power supply circuit, operatively connectable to receive the chip select signal, for generating first and second voltage signals when the chip select signal is received;

a NOR gate, having a first input operatively connected to said power supply circuit, for receiving the first voltage signal, having N address signal inputs for receiving the N address signals, and having an output for generating a first decoded output signal;

an OFF buffer circuit, having a first input operatively connected to the output of said NOR gate for receiving the first decoded output signal, having a second input, having a third input operatively connected to said power supply circuit for receiving the second voltage signal, and having an output operatively connected to the word line for generating a second decoded output signal which is used to select the word line; and a signal generator circuit, having an input operatively connectable to receive the chip select signal and having an output operatively connected to the second input of said OFF buffer circuit, for generating a delayed chip select signal, said signal generator circuit comprising:

a first transistor having a first terminal operatively connected to the first reference voltage, having a second terminal operatively connected to a first node and to receive the chip select signal and having a third terminal, operatively connected to a second node and to the second input of said OFF buffer circuit, for outputting the delayed chip select signal;

a second transistor having a first terminal operatively connected to the second node, having a second terminal operatively connected to a third node and having a third terminal operatively connected to the second reference voltage;

a third transistor having a first terminal operatively connected to the first reference voltage, and having second and third terminals operatively connected to the third node; and a fourth transistor having a first terminal operatively connected to the third node, having a second terminal operatively connected to the first node to receive the chip select signal and having a third terminal operatively connected to the second reference voltage.

10. A decoder circuit according to claim 5, wherein said first and second transistors of said second inverter have a larger current capacity than said first and second transistors of said power supply circuit and said N transistors of said NOR gate.

11. A decoder circuit, operatively connectable to a word line and first and second reference voltages, and operatively connectable to receive a chip select signal and N address signals, said decoder circuit comprising:

a power supply circuit, operatively connectable to receive the chip select signal, for generating first and second voltage signals when the chip select signal is received;

a NOR gate having a first input operatively connected to said power supply circuit, for receiving the first voltage signal, having N address signal inputs for receiving the N address signals, and having an output for generating a decoded output signal;

a buffer circuit, having a first input operatively connected to the output of said NOR gate for receiving the first decoded output signal, having a second input, having a third input operatively connected to said power supply circuit for receiving the second voltage signal, and having an output operatively connected to the word line for generating a second decoded output signal which is used to select the word line; and signal generation means, having an input operatively connectable to receive the chip select signal and having an output operatively connected to the second input of said buffer circuit, for generating a delayed chip select signal overlapping the chip select signal and delayed in phase with respect to the chip delay signal.

* * * * *

UNITED STATES PATENT AND TRADEMARK OFFICE
CERTIFICATE OF CORRECTION

PATENT NO. : 4,446,386

DATED : May 1, 1984

INVENTOR(S) : SETSUO KURAFUJI

It is certified that error appears in the above-identified patent and that said Letters Patent is hereby corrected as shown below:

```
Col. 1, line 9, "small" should be --low--;
Col. 4, line 7, after "Vth" insert --;--;
        line 43, delete "these";
        line 43, before "flowing" insert --,--;
        line 46, delete "ones".
```

Signed and Sealed this

Twenty-sixth Day of March 1985

[SEAL]

Attest:

DONALD J. QUIGG

*Attesting Officer*     *Acting Commissioner of Patents and Trademarks*